United States Patent [19]

Kim et al.

[11] Patent Number: 5,448,370
[45] Date of Patent: Sep. 5, 1995

[54] AUTOMATIC DETECTION OF KIND OF CABLE CONVERTER UNIT COUPLED TO A VCR

[75] Inventors: Sung J. Kim, Fishers; John H. Furrey, Indianapolis, both of Ind.

[73] Assignee: Thomson Consumer Electronics, Inc., Indianapolis, Ind.

[21] Appl. No.: 197,581

[22] Filed: Feb. 17, 1994

Related U.S. Application Data

[63] Continuation of Ser. No. 806,918, Dec. 13, 1991, abandoned.

[51] Int. Cl.[6] ............................................. H04N 5/76
[52] U.S. Cl. ..................................... 358/335; 348/734
[58] Field of Search ............... 358/335, 310, 327, 342; 360/33.1, 35.1; 380/10; 359/146, 143, 188; 348/734, 732

[56] References Cited

U.S. PATENT DOCUMENTS

| | | | |
|---|---|---|---|
| 4,337,486 | 6/1982 | Akutsu et al. | 358/155 |
| 4,425,578 | 1/1984 | Haselwood et al. | 358/84 |
| 4,977,455 | 12/1990 | Young | 358/142 |
| 5,034,819 | 7/1991 | Tsukagoshi | 348/734 |
| 5,034,820 | 7/1991 | Cho | 358/192.1 |
| 5,123,046 | 6/1992 | Levine | 380/10 |

FOREIGN PATENT DOCUMENTS

0223307 2/1987 European Pat. Off. ........ H04B 1/20

Primary Examiner—Jeffery Brier
Assistant Examiner—Robert Chevalier
Attorney, Agent, or Firm—Joseph S. Tripoli; Peter M. Emanuel; Thomas F. Lenihan

[57] ABSTRACT

A VCR controls a cable box, and monitors television signals received from the cable box in a "closed loop" manner. By monitoring an appropriate signal the controller of the VCR can detect perturbations of signal level which indicate that the cable box has changed channels. That is, the output signal of the cable box remodulated on, for example, the RF carrier frequency of channel 3, will be momentarily lost during the period in which the cable box changes channels. Thus, the subject apparatus can automatically determine the proper control code format for the cable box by issuing a channel change command and observing if the cable box responds to the channel change command. In one embodiment of the invention the VCR causes an on-screen display of an error message if it determines that it is unable to control the cable box.

9 Claims, 7 Drawing Sheets

AUTOMATIC DETECTION OF KIND OF CABLE CONVERTER UNIT COUPLED TO A VCR

This is a continuation of application Ser. No. 806,918, filed Dec. 13, 1991, now abandoned.

FIELD OF THE INVENTION

The subject application concerns the field of videocassette recorders (VCRs) and apparatus for programming them.

CROSS REFERENCE TO RELATED APPLICATIONS

The subject patent application is related to applications bearing U.S. patent application Ser. Nos. 807,472, 806,916, and 806,551 filed herewith, and assigned to the same assignee as the subject invention.

BACKGROUND OF THE INVENTION

When a television set owner is a subscriber to a cable television system and also possesses a videocassette recorder (VCR), he may be required to connect to the cable system via a cable decoder box (also called a CATV converter, or a set-top converter). This connection may be required, because in these systems, many cable channels (i.e., the so-called premium channels) are scrambled (i.e., encoded or encrypted) and must be descrambled (i.e., decoded or decrypted) in the cable box. The cable box descrambles the premium channel and converts its RF carrier frequency from its assigned cable channel frequency to a cable box output frequency, normally that of channel 2, 3, 4, or 5 for reception and recording by the VCR, or display by the television receiver. In such an arrangement the viewer may have as many as three remote control units for controlling the video equipment (i.e., one each for a television set, a VCR, and the cable box).

Recently, a programming simplification system known as VCR PLUS TM, manufactured by Gemstar Development Corporation, Pasadena, Calif., has become available. Briefly, the apparatus of the VCR PLUS TM system resembles a standard remote control handunit. The handunit is preprogrammed with the codes for controlling the VCRs and cable control boxes of many manufacturers. The handunit is then programmed by the user with a unique code comprising 1 to 8 digits, which code corresponds to a particular television show broadcast on a given channel, at a given time and date, and having a given duration. A television show which is broadcast at the most popular viewing time (for example, 7 pm) may have a code which comprises only 1 digit. Conversely, a television show which is broadcast at the least popular viewing time (for example, 3 am) may have a code which comprises the full 8 digits. These codes are printed in the channel guide section of the viewer's local newspaper along with the normal time and channel information. After entering the unique 1 to 8 digit code for a particular television show to be recorded, the user places the handunit in a cradle mounted on his VCR to ensure that the handunit is in the proper orientation for transmitting data to the IR (infrared) receiver of the VCR and to the cable box. At the proper time, the VCR PLUS TM handunit transmits IR codes to the cable box to turn it on and tune it to the desired channel, and to the VCR to turn it on and program it to record the desired television show.

Unfortunately, the stand alone VCR PLUS TM handunit operates in an "open-loop" mode. That is, the VCR PLUS TM handunit has no way of knowing if its commands were actually received and executed by either the VCR or by the cable box because no feedback signal to the VCR PLUS TM handunit exists. This situation causes the following problem. There are as many as 44 cable box IR remote control command formats. The VCR PLUS TM handunit has a number of preprogrammed user-selectable remote control formats to allow the handunit to control each of a variety of cable boxes. Unfortunately, the selection of the proper command format must be done by the user. If such selection is made improperly, the the VCR PLUS TM handunit will not be able to control the cable box and the desired program will not be recorded.

SUMMARY OF THE INVENTION

Apparatus in accordance with the subject invention controls a cable box (i.e., the source of its own video input signals), and monitors the television signals received from the cable box, in a "closed loop" manner. By monitoring an appropriate signal the controller of the VCR can detect perturbations of signal level which indicate that the cable box has changed channels. That is, the output signal of the cable box remodulated on, for example, the RF carrier frequency of channel 3, will be momentarily lost during the period in which the cable box changes channels. Thus, the subject apparatus can automatically determine the proper control code format for the cable box by issuing a channel change command and observing if the cable box responds to the channel change command.

In one embodiment of the invention the VCR causes an on-screen display of an error message if it determines that it is unable to control the cable box.

DETAILED DESCRIPTION OF THE EMBODIMENT

Figure 1:
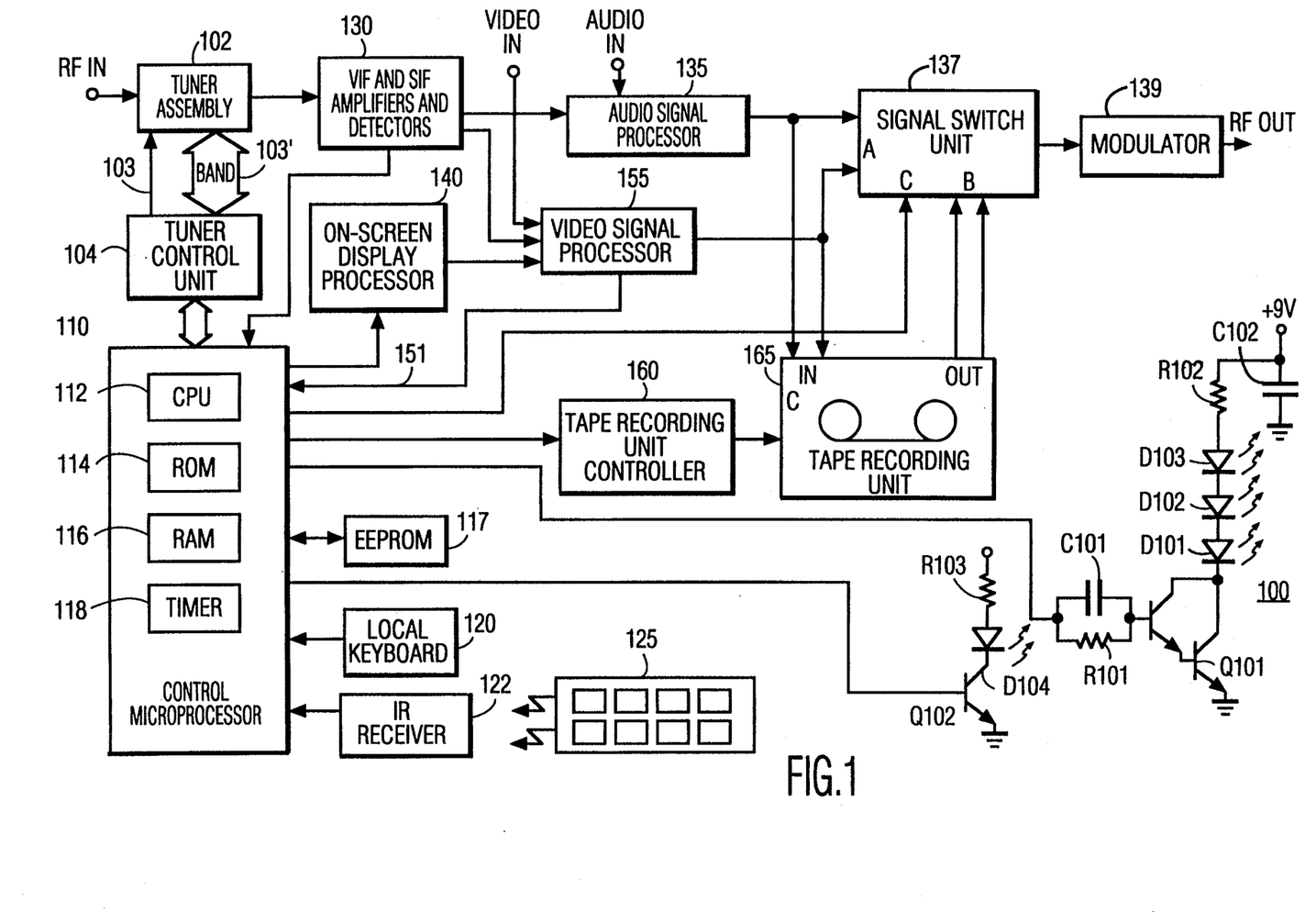
FIG. 1 shows, in block diagram form, a VCR incorporating the subject invention.

Referring to FIG. 1, radio frequency (RF) signals are applied to an RF input terminal of a tuner assembly 102. Tuner assembly 102 selects a particular RF signal under control of a tuner control unit 104 which applies a tuning control signal to tuner assembly 102 via a wire 103, and applies bandswitching signals via a control bus 103'. Tuner control unit 104 is controlled by a controller 110. Controller 110, which may be a microprocessor or microcomputer, includes a central processing unit (CPU) 112, a read-only memory (ROM) 114, a random access memory 116, and an external electrically-erasable read only memory (EEPROM) 117. Controller 110 generates a control signal for causing tuner control unit 104 to control tuner 102 to select a particular RF signal, in response to user-entered control signals from a local keyboard 120 and from an infrared (IR) receiver 122. IR receiver 122 receives and decodes remote control signals transmitted by a remote control unit 125.

Tuner 102 produces a signal at an intermediate frequency (IF) and applies it to a processing unit 130 comprising a video IF (VIF) amplifying stage, an AFT circuit, a video detector, and a sound IF (SIF) amplifying stage. Processing unit 130 produces a first baseband composite video signal (TV), and a sound carrier signal. The sound carrier signal is applied to an audio signal processor unit 135 which includes an audio detector and may include a stereo decoder. Audio signal processor unit 135 produces a first baseband audio signal and applies it to a signal switch unit 137. Second baseband composite video signals and second baseband audio signals may be applied to VIDEO IN and AUDIO IN terminals from an external source.

The first and second baseband video signals (TV) are coupled to a video processor unit 155 (having a selection circuit not shown) and is also applied to signal switch unit 137. Video and audio signals are also applied to a tape recorder unit 165 which causes the signals to be recorded onto video tape. Tape recorder unit 165 has a control input and operates under control of a tape recorder unit controller 160, which may be a microprocessor. Tape recorder unit controller 160 is in turn controlled by control signals from controller 110. Under control of controller 110, an on-screen display processor 140 generates character signals, and applies them to a second input of video signal processor 155, for inclusion in the processed video signal. Signal switch unit 137 is controlled by controller 110 via a control input terminal C to select audio and video signals from audio signal processor 135 and video signal processor 155, or from the output terminals of tape recording unit 165 in the playback mode, and to apply the selected signals to a modulator 139 for modulation onto a particular channel frequency carrier, typically that of channel 3 or channel 4. That portion of the circuitry shown in FIG. 1 which has been described thus far is known from RCA videocassette recorder model VR520.

Unlike the RCA VR520, which has as its main programming feature a TIMER PROGRAM mode of operation, apparatus according to the subject invention may include both a TIMER PROGRAM programming feature and a VCR PLUS TM programming feature. The control program for the above-mentioned features resides in ROM 114 of controller 110. Electrically-erasable programmable read only memory (EEPROM) 117 is coupled to controller 110, and serves as a nonvolatile storage element for storing autoprogramming channel data, user-entered channel data, and VCR PLUS TM channel mapping data.

An IR LED driver circuit, generally, designated 100, is coupled to controller 110, for providing IR signals to external units, such as a cable box for a cable TV service. IR LED driver circuit comprises a filter capacitor C102, a current-limiting resistor R102, three series-connected IR LEDs (infrared light emitting diodes) D101, D102, and D103, a darlington-connected transistor switch Q101, a base resistor R101, and a speed-up capacitor C101. Controller 110 also controls a visible light LED D104 via an LED driver circuit comprising a resistor R103 and a transistor Q102. Visible light LED D104 serves as an indicator that the TIMER recording function is enabled.

Processing unit 130 also produces an IF AGC signal which is coupled to controller 110 via a wire 131, for detection of variation of the signal strength of signals of currently-tuned channels, the changes being indicative of channel changes. Alternatively, video signal processor 155 produces a valid sync detection signal (or a video AGC signal) which is coupled to controller 110 via a wire 151, for detection of valid TV sync, changes in the detection of valid TV sync being indicative of channel changes.

It is herein recognized that it is a clear advantage for the unit which contains the VCR PLUS TM control code (in the subject case, the VCR) for controlling the cable box, to be coupled to the television antenna line, so that the controller can determine whether or not the cable box is actually responding to transmitted IR commands. As noted above, there are about 44 different cable box IR remote control command formats. With an "open loop" type of system, such as implemented in the VCR PLUS TM handunit, the controller has no way of knowing if the cable box responds to the transmitted command or not. Thus, if the cable box is inadvertently switched to select the wrong cable box command code format, the desired channel change will not be accomplished, and the desired program will not be recorded.

In contrast, apparatus in accordance with the subject invention controls the cable box (i.e., the source of its own video input signals), and monitors the television signals received from the cable box, in a "closed loop" manner. By monitoring the IF AGC signal on line 131 of FIG. 1, controller 110 can detect perturbations of the signal level which indicate that the cable box is, in fact, receiving and executing commands as indicated by the fact that it can change channels. That is, the output signal of the cable box remodulated on, for example, the RF carrier frequency of channel 3, will be momentarily lost during the period in which the cable box changes correct cable box command code format by issuing channel change commands and determining if the cable box responds to the channel change commands.

It is also recognized that other signals (such as a "Valid Sync Detect" signal or baseband video AGC coupled by line 151 of FIG. 1) can also be monitored to provide this feedback information as to whether commands transmitted to the cable box have actually been received and executed. Advantageously, if a signal which tracks a characteristic of the baseband video signal (such as Valid Sync Detect or baseband video AGC) is used for detecting loss of signal during channel change, then the subject invention is applicable to use with cable boxes which produce decoded cable television signals at baseband rather than remodulating them to a particular television channel frequency.

The present invention will be further described with reference to FIGS. 2a and 2b, 3 and 4a–4g.

Figure 2A:
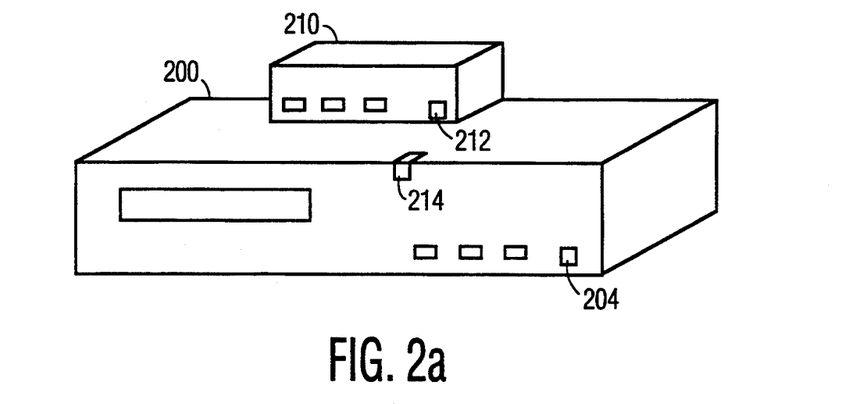
FIGS. 2a and 2b are views of a VCR incorporating the invention.
Figure 2B:
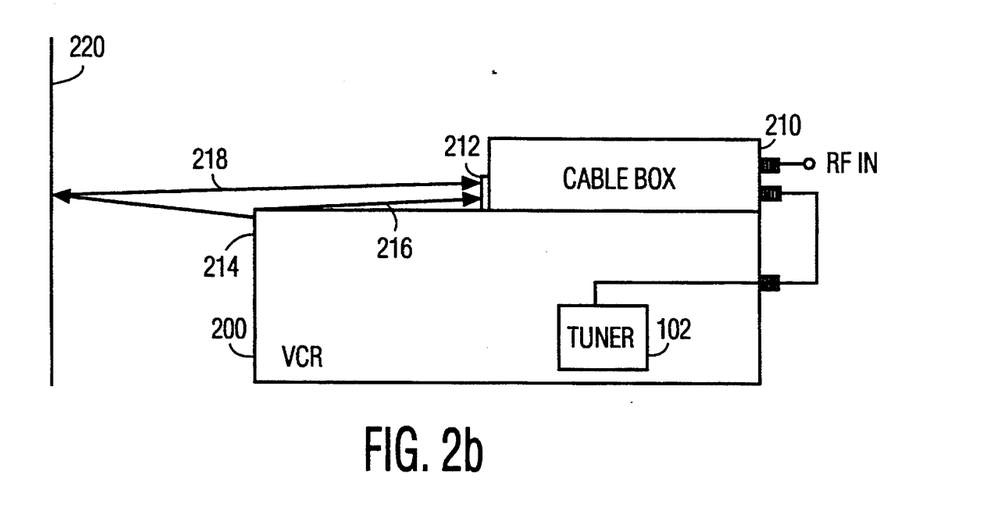

FIG. 2a is a perspective view of a cable box 210 placed VCR 200 having a, In FIG. 2b, VCR 200 is shown coupled to the RF input via cable box 210. Tuner 102 of FIG. 2b is the same tuner unit 102 previously described with respect to FIG. 1. It is common practice for cable television services to encode (i.e., scramble) at least their "Premium" channels. FIG. 2b is a configuration which may be used when some or all of the television channels provided by the cable television service are encoded in some fashion (i.e., a cable box is required for decoding). In such a configuration, the VCR will be set to record all television programs on the cable box output channel (typically, channel 2, 3, or 4). Cable box 210 of FIGS. 2a and 2b includes a window 212 for admitting an IR (infrared) remote control signal for turning the cable box on and off, and for causing the tuner of the cable box to change channels. VCR 200 of FIGS. 2a and 2b includes a window 204 for admitting an IR (infrared) remote control signal for turning the VCR on and off, for causing the tuner 102 of the VCR to change channels, and for controlling the recording and playback of videotapes. VCR 200 also includes a window 214 through which IR signals generated by the VCR are transmitted to external units such as cable box 210. Note from FIG. 2b that cable box 210 preferably receives IR signals from window 214 of VCR 200 along a rearward directed path 216, and from a "bounce" path 218 in which the IR signals may be reflected from a wall or other object 220. The rearward direction of the IR light provides more assurance that the VCR-generated IR commands will reach the cable box. It is important to note that because the "bounce" IR light path 218 is always longer than the more direct rearward path 216, more IR power is required to ensure remote control signal reception at the cable box. For this reason, two IR LEDs are directed along the longer bounce path. The two generally forward-facing LEDs may also be angled outward from each other (i.e., along diverging paths) in order to cover more area and increase the chance of reflecting a signal back to the cable box. The "bounce" path is provided for the case in which the user chooses not to place the cable box on top of the VCR.

Figure 4A:
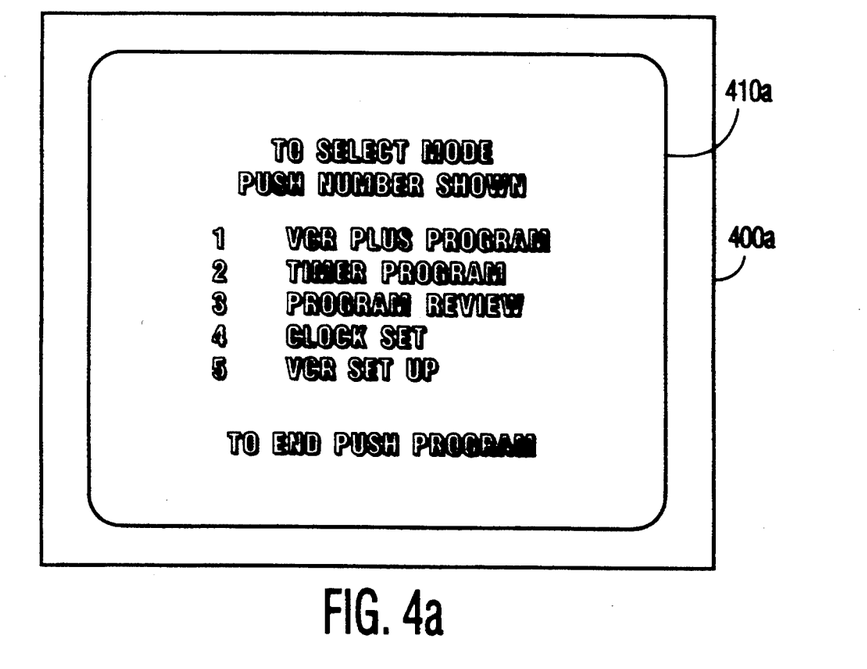
FIGS. 4a–4g are screen displays generated by the controller of FIG. 1.

With respect to FIGS. 4a through 4g, assume that a VCR according to the present invention is coupled to a television set 400a-400g, having a picture tube 410a-410g, respectively. FIG. 4a shows a display screen displayed in response to the pressing of the PROGRAM key of remote control handunit 125. Note that by pressing either key 1 or key 2, the user can program a television show for recording by means of the VCR PLUS TM system or by normal TIMER PROGRAM recording, respectively. Options 3 and 4 are standard features and need not be described here.

Figure 4B:
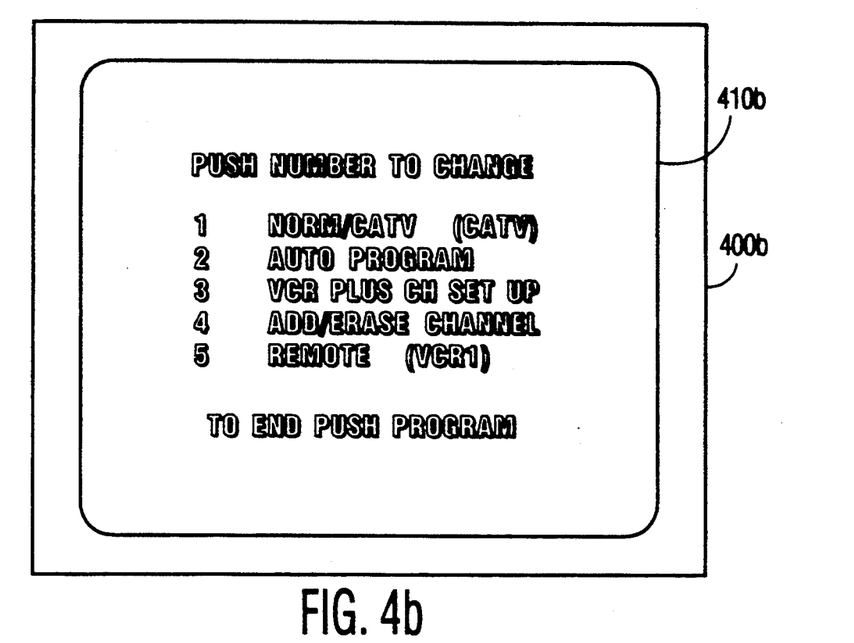
Figure 4C:
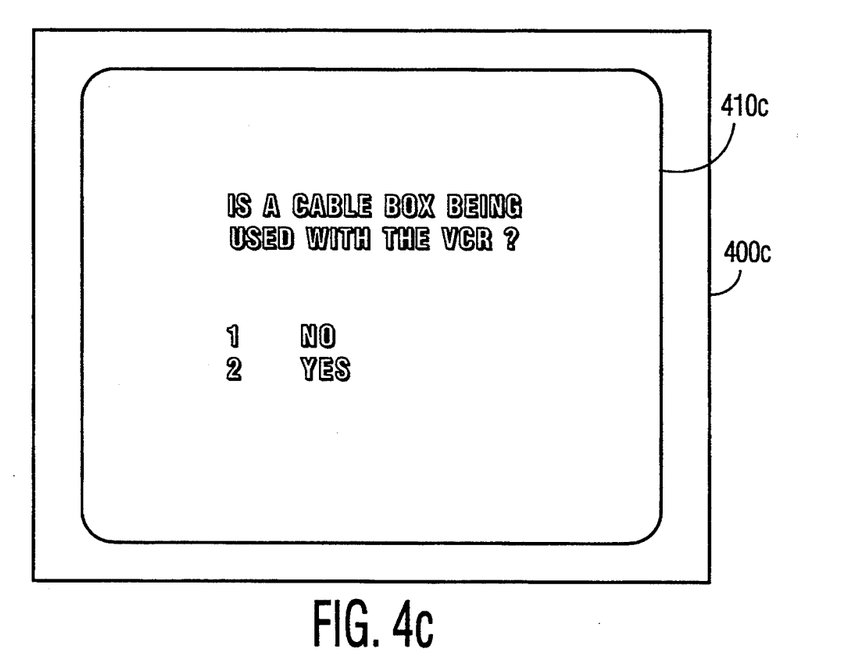

In response to the pressing of key number 5, VCR SET UP, the display screen of FIG. 4b is generated, which provides another list of 5 options. Selecting item 1 enables the user to toggle back and forth between controlling tuner 102 to tune NORMAL (i.e., broadcast or "air") and controlling tuner 102 to tune CATV (i.e., cable) frequencies. Selecting item 2 causes an AUTO-PROGRAM function to be implemented in which tuner 102 is controlled to search for all active channels and compile a list of channels which are available to be tuned, and those which are inactive and are to be skipped over. The selection of menu item 4 allows a user to add a channel to the list or delete a channel from the autoprogram scan list. Menu item 5 is not relevant to the subject invention and need not be described here. Selection of menu item 3 causes the display of the screen shown in FIG. 4c.

Figure 4D:
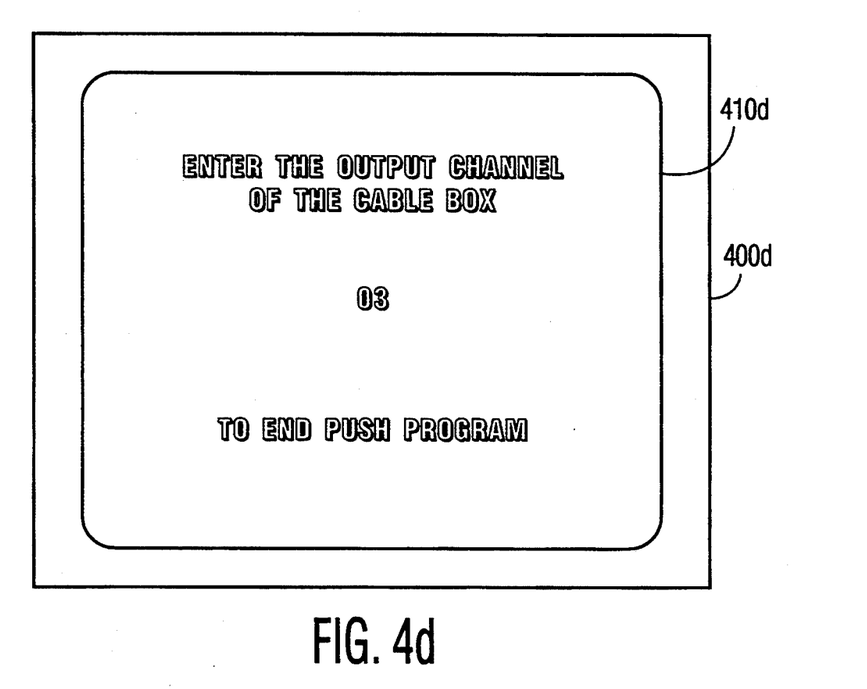
Figure 4E:
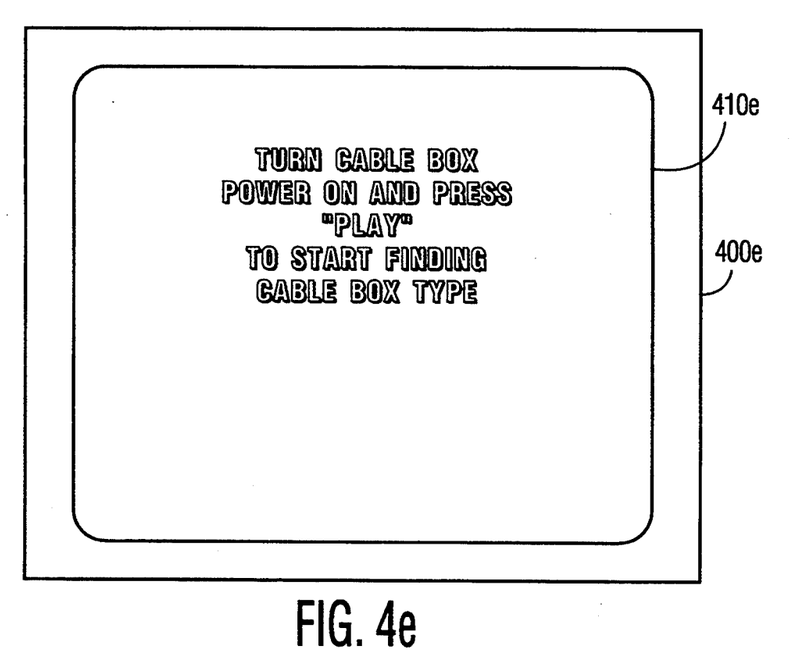

If key 1 is pressed, it means that the user has a cable television service which does not require a cable box. If key 2 were pressed, it means that the user has a cable box, as shown in FIGS. 2a and 2b. In that case, the screen of FIG. 4d is displayed, (it is to be understood that the "03" is the output channel of the cable box, and is entered by the user), and the output channel information is stored. Controller 110 then causes the display of the screen of FIG. 4e, in which the user is instructed to turn on the cable box, and to press the PLAY key of VCR remote control handunit 125.

Figure 3:
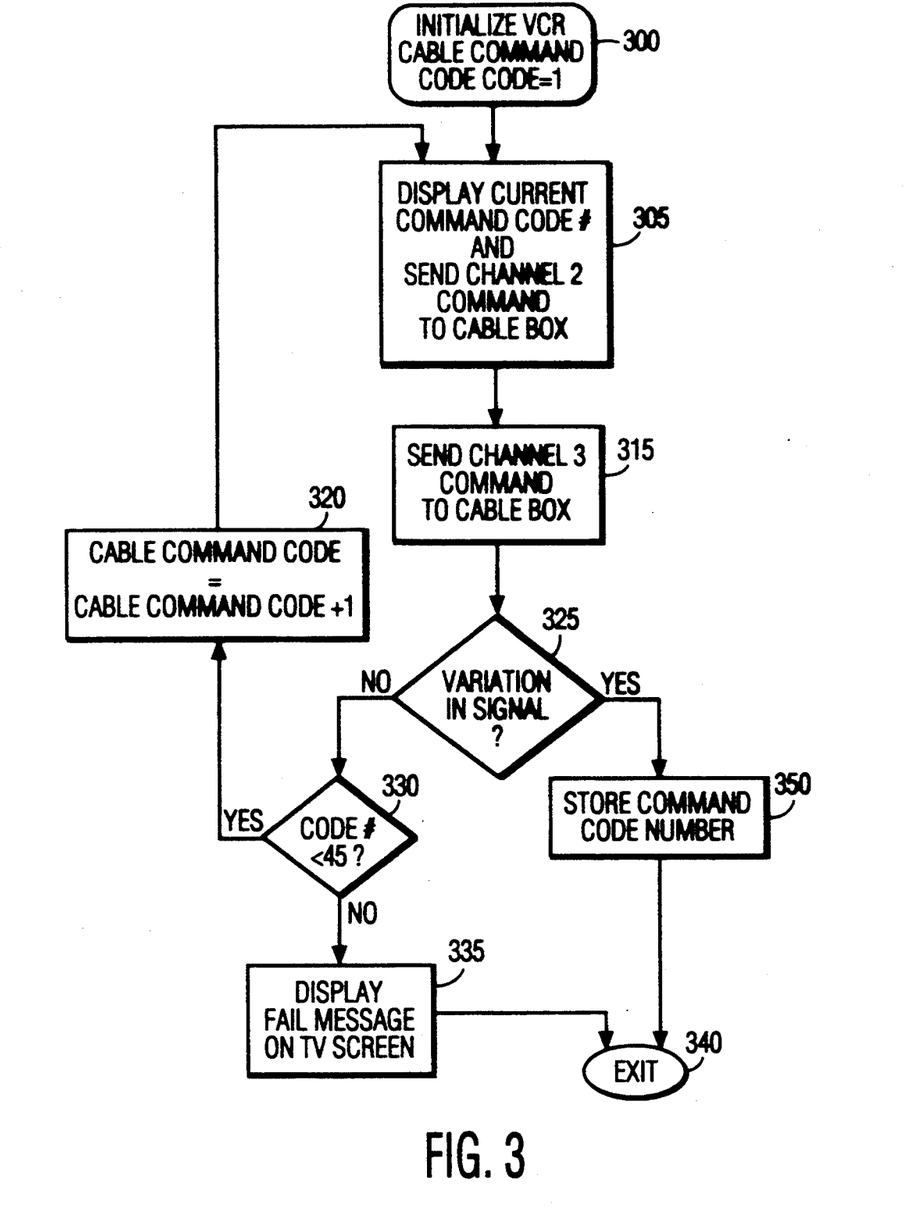
FIG. 3 is a flowchart showing a portion of the control program of the controller of FIG. 1.
Figure 4F:
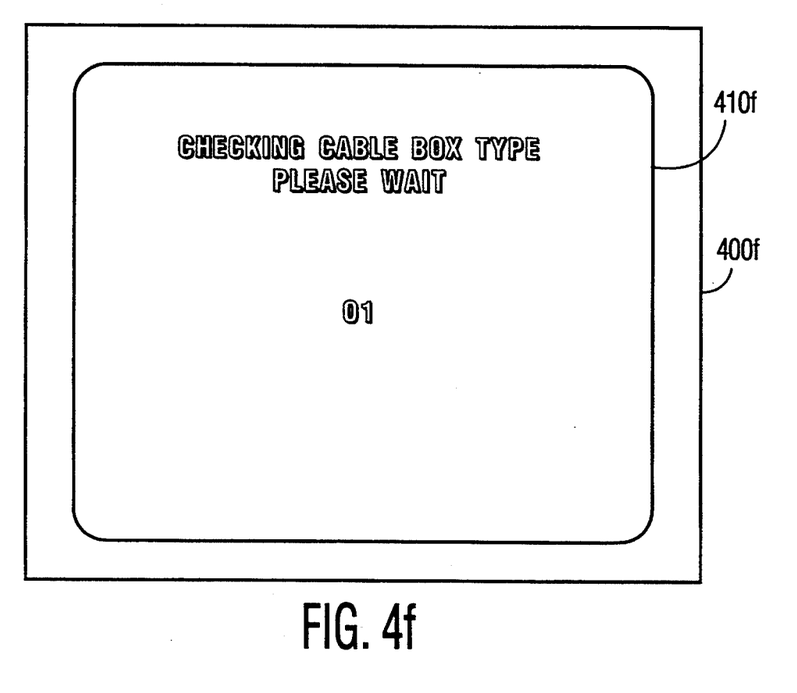
Figure 4G:
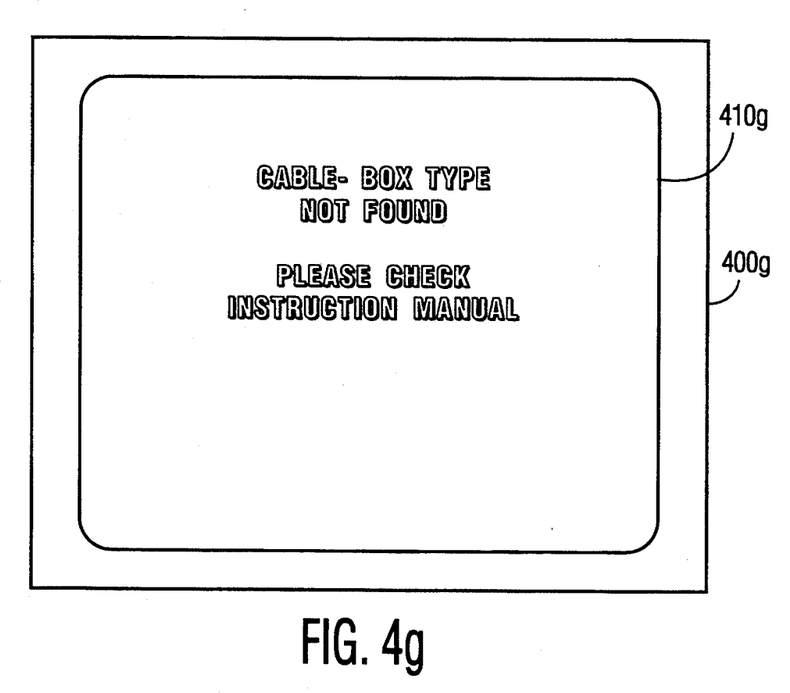

In response to the reception of the PLAY command, controller 110 causes the display of the screen of FIG. 4f, and executes the program shown in the flowchart of FIG. 3.

FIG. 3, shows a portion of the control program of controller 110 of VCR 200. The routine illustrated in FIG. 3 automatically determines the type of remote control format to which cable box 210 is programmed to respond, so that any channel change commands which may be required to record the desired television programs can be transmitted to the cable box properly. The program is entered at step 300 in which the cable command code memory is initialized to the first of 44 preprogrammed code formats. At step 305, the cable box channel 2 command is sent to the cable box, and the cable command code number (i.e., 01–44) currently being tried is displayed, as shown in FIG. 4f. At step 315, the cable box code for channel 3 is transmitted to the cable box. If the currently selected cable box command code format is correct, then there will be a variation in the monitored signal (i.e., such as video AGC), as the cable box changes from channel 2 to channel 3. This variation is looked for in step 325. If no variation is present, then the cable box command code is incorrect. In that case, a check is made that the incrementing procedure of step 320 has not yet caused the cable command code number to reach a count of 45 (step 330). A count of 45 indicates that all preprogrammed command code formats have been tried without success, the NO path serving as a point at which to terminate the routine, and escape the loop. Therefore, if at step 330, if the cable command code number is less than 45, the program advances to step 320 wherein the cable command code memory is incremented, then loops back to step 305, and once again issues the channel change commands to the cable box. If the cable command code number exceeds 44, the NO path is taken from step 330 to step 335, a "fail" message (such as the one shown in FIG. 4g) is displayed for about five seconds on the screen of a television receiver which may be connected to the VCR. The program is then exited at step 340, to return to the main menu.

Returning to step 325, if a variation in the television signal were detected, the YES path is taken to step 350 wherein the automatically detected command code format number is stored for future use. The routine is then exited at step 340.

Although the VCR PLUS TM system is referred to in the subject specification, it is herein recognized that the subject invention does not require the use of the VCR PLUS TM system and is extremely useful with standard timer recording.

What is claimed is:

1. A videocassette recorder, comprising:

a radio frequency (RF) signal input terminal, for receiving a particular RF signal from a controllable external source of RF signals, said controllable external source of RF signals having a first tuner being capable of tuning to a plurality of channels;

said videocassette recorder further including, a second tuner coupled to said RF signal input terminal for receiving said particular RF signal, said second tuner tuning said particular RF signal in response to a control signal;

a microprocessor for generating said control signal for causing said second tuner to tune said particular RF signal;

a data entry unit, coupled to said microprocessor, for entering data in response to operation by a user; and a transmitter coupled to said microprocessor, for transmitting remote control signals for controlling said controllable external source of RF signals;

said microprocessor, in response to data entered by said user generates said remote control signals and applies said remote control signals to said remote control signal transmitter; and a detector for detecting an active television signal, said detector being coupled to said second tuner for receiving a signal derived from said particular RF signal, and in response to the detection of a predetermined characteristic of said particular RF signal generates a signal indicative of an active television signal and applies said indicative signal to said microprocessor, said indicative signal exhibiting a variation when said first tuner is tuned from channel to channel;

said microprocessor selecting a first control signal transmission format of a plurality of control signal transmission formats and transmitting a first one of said remote control signals for causing said controllable external source of said particular RF signal to tune a first channel and thereafter transmits a second one of said remote control signals in said selected format for causing said controllable external source of RF signals to tune to a second channel and thereafter monitors said indicative signal for said variation of said indicative signal;

said microprocessor determining that it has identified the proper transmission format for controlling said controllable external source of RF signals upon detecting said variation of said indicative signal and determining that it has not identified said proper transmission format for controlling said external source of RF signals upon failing to detect said variation of said indicative signal; and said microprocessor, upon determining that it has not identified said proper transmission format for controlling said controllable external source of RF signals, selects a second control signal transmission format, transmits in said second control signal transmission format and monitors said indicative signal for said variation.

2. The videocassette recorder of claim 1, wherein said transmitter is an IR LED assembly, and said remote control signals are IR signals.

3. The videocassette recorder of claim 1, wherein said detector is an automatic gain control (AGC) circuit, and said signal indicative of an active television signal is an AGC signal.

4. The videocassette recorder of claim 1, wherein said detector is a valid television synchronizing signal detection circuit, and said signal indicative of an active television signal is a signal indicative of the detection of a valid television synchronizing signal.

5. The videocassette recorder of claim 1, further comprising:

means for displaying on-screen messages on a display screen of a television set;

said microprocessor, upon determining that it has not identified said proper transmission format for controlling said controllable external source of RF signals causes said on-screen display means to produce a message indicative of failure.

6. A videocassette recorder, comprising:

a baseband video signal input terminal, for receiving a baseband video signal from an external source of video signals, said external source of video signals having a tuner capable of tuning a plurality of channels, said external source of video signals providing a video signal derived from a selected one of said channels as said baseband video signal;

a microprocessor for generating control signals;

means, coupled to said microprocessor, for entering data in response to operation by a user; and means coupled to said microprocessor for transmitting a remote control signal for controlling said external source of said video signals;

said microprocessor in response to data entered by said user generates said remote control signals and applies said remote control signals to said remote control signal transmitting means; and means for detecting a characteristic of an active television signal, said detecting means being coupled to said baseband video signal input terminal for receiving said baseband video signal, and in response to the detection of a predetermined characteristic of said baseband video signal generates a signal indicative of an active television signal and applies said indicative signal to said microprocessor, said indicative signal exhibiting a variation when said tuner of said external source of video signals is tuned from channel to channel;

wherein said microprocessor selects a first control signal transmission format of a plurality of control signal transmission formats and transmits a first one of said remote control signals for causing said external source of said video signals to tune a first channel and thereafter transmits a second one of said remote control signals in said selected format for causing said external source of said video signals to tune a second channel and thereafter monitors said indicative signal for said variation;

said microprocessor determining that it has identified the proper transmission format for controlling said external source of video signals upon detecting said variation and determining that it has not identified said proper transmission format for controlling said external source of video signals upon failing to detect said variation; and said microprocessor, upon determining that it has not identified said proper transmission format for controlling said external source of video signals, selects a second control signal transmission format, transmits in said second control signal transmission format and monitors said indicative signal for said variation.

7. The videocassette recorder of claim 6, wherein said transmitter is an IR LED assembly, and said remote control signals are IR signals.

8. The videocassette recorder of claim 6, wherein said detector is a valid television synchronizing signal detection circuit, and said signal indicative of an active television signal is a signal indicative of the detection of a valid television synchronizing signal.

9. The videocassette recorder of claim 6, further comprising:

means for displaying on-screen messages on a display screen of a television set;

said microprocessor, upon determining that it has not identified said proper transmission format for controlling said external source of video signals causes said on-screen display means to produce a message indicative of failure.

* * * * *